(12) United States Patent
Walschap (10) Patent No.: US 8,013,590 B1
(45) Date of Patent: Sep. 6, 2011

(54) SENSOR CIRCUIT

(75) Inventor: Tom Walschap, Belgium (BE)

(73) Assignee: ON Semiconductor Trading, Ltd, Hamilton (BM)

( * ) Notice: Subject to any disclaimer, the term of this patent is extended or adjusted under 35 U.S.C. 154(b) by 232 days.

(21) Appl. No.: 12/501,811

(22) Filed: Jul. 13, 2009

(51) Int. Cl.
*G01R 19/00* (2006.01)

(52) U.S. Cl. ................ 324/76.11; 324/500; 324/686

(58) Field of Classification Search .................. None
See application file for complete search history.

(56) References Cited

U.S. PATENT DOCUMENTS

| | | | |
|---|---|---|---|
| 7,755,348 B1 * | 7/2010 | Shah et al. | 324/123 R |
| 2007/0216396 A1 * | 9/2007 | Coulson | 324/117 R |

* cited by examiner

Primary Examiner — Huy Phan
Assistant Examiner — Trung Q Nguyen (57) ABSTRACT

A method of measuring signals related to a photodiode based sensor and calculating a corrected data value thereof is disclosed. A nominal reset voltage value of the photodiode may be measured. A knee point voltage may be applied to the photodiode and resets a voltage on the photodiode to the knee point voltage when the voltage on the photodiode falls below the knee point voltage. Applying the knee point voltage may extend the dynamic range of the sensor. An output voltage of the photodiode at end of an integration time of the photodiode may be measured. The knee point voltage may be applied again after the end of the integration time. A voltage value of the photodiode of the knee point voltage may be measured. The nominal reset voltage value, the output voltage of a sensor and the knee point voltage may be reported to calculate the corrected data value.

21 Claims, 6 Drawing Sheets

SENSOR CIRCUIT

TECHNICAL FIELD

Embodiments of the present invention relate to the field of electronics. More particularly, embodiments of the present invention relate to extending a dynamic range of a sensor circuit.

BACKGROUND

In general, light sensor elements, or pixels, can be subjected to different brightness and light intensity. Each pixel reaches a saturation level at a different time based on the detected brightness. In other words, the slope of each pixel will vary depending on the amount of light reaching the pixel, where the slope is its voltage plotted over time, e.g., the voltage as the y-axis and the time as the x-axis.

Accordingly, a pixel with a greater slope reaches saturation level faster in comparison to other pixels. When the saturation level during the integration time of a pixel is reached the collection of brightness information for that pixel stops.

SUMMARY

In one embodiment, an offset voltage introduced when a pixel voltage is reset to a given threshold voltage is measured in order to extend the pixel dynamic range during integration time. The measured offset voltage may be corrected in order to maximize image quality. The offset voltage may be measured and corrected with minimal impact on the amount of memory and processing power specified, e.g., by linearizing the pixel behavior as discussed in more detail herein.

In one embodiment of the present invention, a nominal reset voltage value of a photodiode (e.g., a pixel sensor) may be measured. For example, the nominal reset voltage value may be measured by resetting a collection capacitor and measuring its change. At a set time over the integration time of the pixel, a voltage value of the photodiode may be reset to a first knee point voltage value when the voltage value of the photodiode lies below the first knee point voltage value. At the end of the integration time of the pixel, the voltage value of the photodiode may be transferred to the collection capacitor by transferring a charge associated therewith. Measuring the collected charge on the collection capacitor provides the voltage measurement for the pixel at the end of the integration time.

Because the first knee point voltage value may vary from one pixel to the next, the first knee point voltage value may be measured in order to compensate for the offset value introduced, and resulting from resetting the photodiode to the first knee point voltage. Accordingly, the photodiode may be initialized to a predetermined value, e.g., reset to its lowest voltage value. The collection capacitor may be reset and a second knee point voltage signal may be subsequently asserted for the same pixel. The second knee point voltage signal may be approximately the same amplitude as the first knee point voltage value. The charge associated with the second knee point voltage signal may be collected on the capacitor and subsequently measured, as discussed above. Measuring the charge collected on the capacitor provides the second knee point voltage value, which may be approximately the same as the first knee point voltage value. Therefore, the offset introduced to a given pixel as a result of the knee voltage reset may be directly measured and recorded for each pixel sensor circuit.

According to one embodiment, the corrected data value of a pixel sensor may be the nominal reset voltage value minus the output pixel voltage at the end of the integration time, when the nominal reset voltage value minus the output pixel voltage all divided by a gain may be greater than the nominal reset voltage value minus the first knee point voltage. The corrected data value may be the first knee point voltage value minus the output pixel voltage at the end of the integration time all multiplied by a gain plus the nominal reset voltage value minus the first knee point voltage value when the nominal reset voltage value minus the output pixel voltage all divided by the gain at the end of integration time may be less than the nominal reset voltage value minus the first knee point voltage. Accordingly, the corrected data may be compensated value for the offsets introduced by the pixel sensor, thereby maximizing the image quality. Moreover, the offset values introduced may be calculated with minimal impact on the amount of circuitry used for the pixel sensor and the response of the pixel sensor becomes linearized.

An embodiment pertains to a method of measuring signals related to a photodiode having a wide dynamic range. The method includes measuring a nominal reset voltage value of the photodiode. A first knee point voltage may be asserted for the photodiode. In one embodiment, the first knee point voltage extends a dynamic range of the photodiode by resetting a voltage on the photodiode to the first knee point voltage for any photodiode voltage below the first knee point voltage. The first knee point voltage may be asserted at a predetermined time after a start of the integration time and prior to an end of the integration time. An output voltage associated with the photodiode at the end of an integration time of the photodiode may be measured.

Subsequent to the end of the integration time, a second knee point voltage may be asserted for the photodiode. The second knee point voltage may have a value approximately equal to a value of the first knee point voltage. Subsequent to asserting the second knee point voltage, a voltage value of the photodiode corresponding to the second knee point voltage may be measured. The nominal reset voltage value, the output voltage and the voltage value of the photodiode after the second knee point voltage may be applied may be reported, e.g., stored.

Measuring the nominal reset voltage value may include resetting a capacitor. A first charge (the nominal voltage) may be collected and measured on the capacitor prior to transferring a second charge (i.e., the data value) from the photodiode to the capacitor.

According to an embodiment, the data value the output voltage may be measured by transferring the charge from the photodiode to the capacitor at the end of the integration time. The charge may be collected by the capacitor. Accordingly, the collected charge may be measured where the collected charge may be related to the voltage associated with the photodiode at the end of the integration time and as effected by the first knee point voltage applied thereto.

According to an embodiment, the voltage value of the photodiode corresponding to the second knee point voltage may be measured by initializing the photodiode to a predetermined value, e.g., lowest voltage value for the photodiode, e.g., after the integration time ends. It is appreciated that the capacitor may be reset and the photodiode may be initialized prior to asserting the second knee point voltage. A charge associated with the second knee point voltage may be collected by the capacitor. Accordingly, the collected charge on the capacitor may be directly measured.

The measured values, e.g., the nominal reset voltage value, the second knee point voltage value and the output voltage value, may be used to calculate the corrected data value. According to one embodiment, the corrected data value may be the nominal reset voltage minus the output voltage value when the nominal reset voltage value minus said output voltage value all divided by a gain may be greater than the nominal reset voltage value minus the voltage value of said photodiode. In one embodiment, the corrected data value may be the voltage value of the photodiode minus the output voltage value all of which are multiplied by a gain plus the nominal voltage value minus the voltage value of the photodiode when the nominal reset voltage value minus the output voltage value all divided by the gain may be less than the nominal reset voltage value minus the voltage value of the photodiode. According to an embodiment, the gain may be a duration of the integration time divided by an elapsed time measured at the start of when the first knee point voltage may be applied until the end of integration time.

BRIEF DESCRIPTION OF THE DRAWINGS

Embodiments of the present invention are illustrated by way of example, in the figures of the accompanying drawings and in which like reference numerals refer to similar elements and in which.

DETAILED DESCRIPTION

Reference will now be made in detail to embodiments of the present invention, examples of which are illustrated in the accompanying drawings. Embodiments are intended to cover alternatives, modifications and equivalents, which may be included within the spirit and scope of the disclosure.

Figure 1:
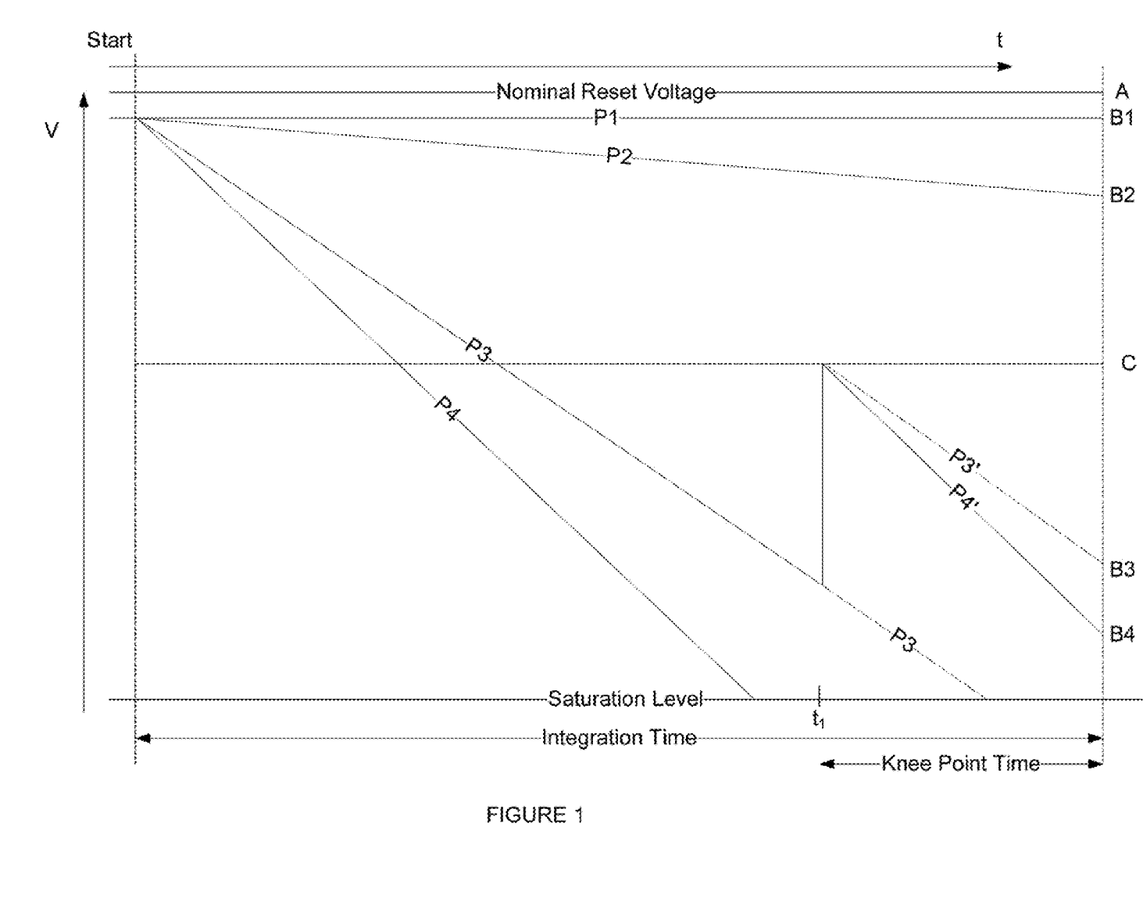
FIG. 1 shows behavior of pixel sensor circuits upon application of a knee point voltage to extend the dynamic range of pixels in accordance with an embodiment of the present invention.

Referring now to FIG. 1, behaviors of pixel sensor circuits, e.g., pixels, upon application of a knee point voltage to extend the dynamic range of pixels in accordance with one embodiment of the present invention are shown. The pixels may be located within an array of pixels of an image sensor. The voltage responses of four pixels P1, P2, P3 and P4 are shown. It is appreciated that each pixel may be associated with a different photodiode. Each pixel is exposed to a different brightness and therefore reaches saturation level at a different time. For example, the first pixel P1 and the second pixel P2 never reach saturation while pixels P3 and P4 reach saturation at different times. In other words, a steeper slope indicates that saturation will be reached faster.

In this embodiment, pixels P3 and P4 reach saturation level during the integration time and may result in less than optimal image quality. Application of a knee point voltage, e.g., C, to the photodiodes associated with pixels P3 and P4 prevent pixels P3 and P4 from reaching saturation level during integration time. In other words, the knee point voltage, e.g., C, resets the voltage associated with the photodiodes of pixels P3 and P4 to the knee point voltage value at time $t_1$ because the voltage values of P3 and P4 are less than the knee point voltage value, e.g., C. As a result, the dynamic range of pixels, e.g., P3 and P4, that otherwise would have reached saturation level are extended. Resetting photodiodes associated with pixels P3 and P4 at time $t_1$ results in pixel voltages B3 and B4 respectively at the end of integration time. It is appreciated that voltages associated with pixels P3 and P4 are both greater than the saturation level at the end of the integration time.

It is appreciated that the knee point voltage C may be asserted at a predetermined time, e.g., $t_1$, which occurs prior to end of integration time. Application of a knee point voltage to photodiodes associated with pixels P1 and P2 does not reset their respective voltages at time $t_1$ because the voltage values of pixels P1 and P2 are higher than the knee point voltage value C at time $t_1$. At the end of integration time, pixels P1 and P2 have voltage values B1 and B2 respectively, both of which are above the saturation level.

As a result of asserting the knee point voltage, pixels P3 and P4 have voltage values B3 and B4 respectively at the end of integration time instead of reaching saturation level. In other words, application of the knee point voltage at a predetermined time during the integration time resets a photodiode associated with a pixel if the pixel voltage is below the knee point voltage value, e.g., C, at $t_1$.

it is appreciated that the pixel sensor circuitry may have some residual charge associated therein. For example, despite a complete reset, some charge may remain on the pixel capacitance, resulting in a voltage referred to as the nominal reset voltage, e.g. A. Compensating for this nominal reset voltage maximizes image quality and pixel linearity of response.

It is appreciated that the knee point voltage may reset the photodiodes multiple times during the integration time according to one measurement technique. As such, resetting the photodiodes associated with pixels P3 and P4 once is illustrative and not intended to limit the scope of the present invention.

As presented above, application of the knee point voltage C introduces an offset voltage that can be measured and corrected for in order to maximize image quality. In order to calculate the corrected data voltage, the knee point voltage value, e.g., C, a nominal reset voltage, e.g., A, and the pixel voltage value at the end of integration time, e.g., B1, B2, B3 and B4 are measured in accordance with embodiments of the present invention. It is appreciated that the measurement of these values and subsequent calculation of the corrected data voltage occurs with minimal impact on the amount of memory circuitry used by the pixel sensor.

Figure 2A:
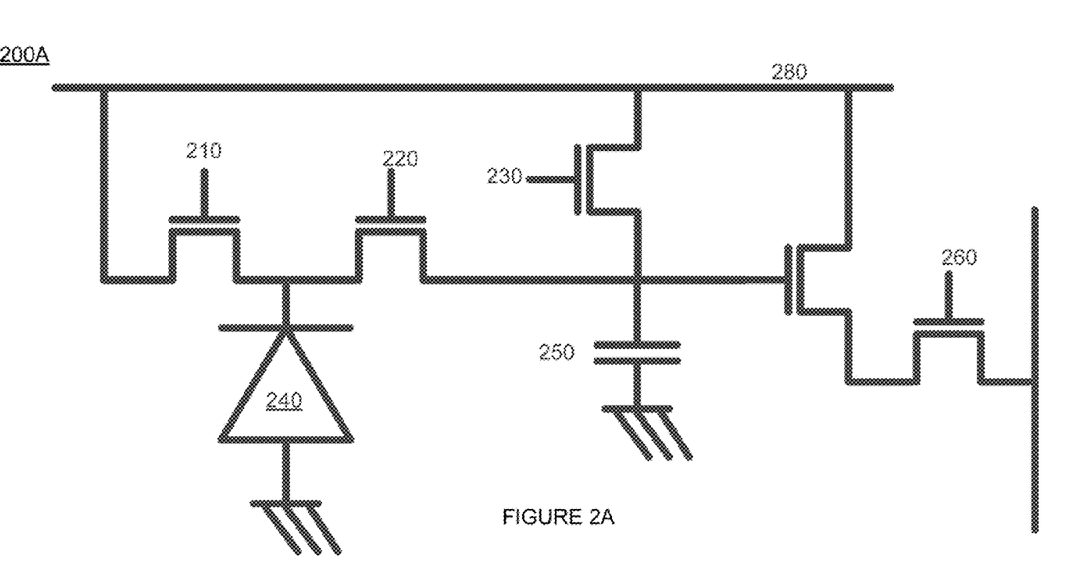
FIGS. 2A and 2B show circuit diagram and a timing diagram, respectively, in accordance with an embodiment of the present invention.

Referring now to FIG. 2A, a circuit diagram 200A of a pixel sensor circuit in accordance with one embodiment of the present invention is shown. The circuit 200A comprises an initialization switch 210, a photodiode 240, a transfer switch 220, a reset switch 230, a collection capacitor 250 and a readout switch 260. A voltage line 280 is $V_{dd}$.

According to one embodiment of the present invention, the initialization switch 210 may be used to initialize the photodiode 240. For example, the initialization switch 210 may be an anti-blooming transistor that initializes the photodiode 240 to a high voltage.

Moreover, it is appreciated that the initialization switch 210 may be used to apply a knee point voltage at its gate. For example, the output voltage of the photodiode 240 may reset to the knee point voltage value, e.g., C, at a predetermined time if the output voltage of the photodiode 240 may lower than the knee point voltage, e.g., C, assuming C may be asserted at the gate of 210. On the other hand, the output voltage of the photodiode 240 may be unaltered at a predetermined time if the output voltage of the photodiode 240 may be greater than the knee point voltage, e.g., C, as applied at the gate of the initialization switch 210.

The transfer switch 220 may be used to transfer a charge from the output of the photodiode 240 to the capacitor 250. The reset switch 230 may be used to reset the capacitor 250. The readout switch 260 may be used to measure a charge collected on the capacitor 250.

Figure 2B:
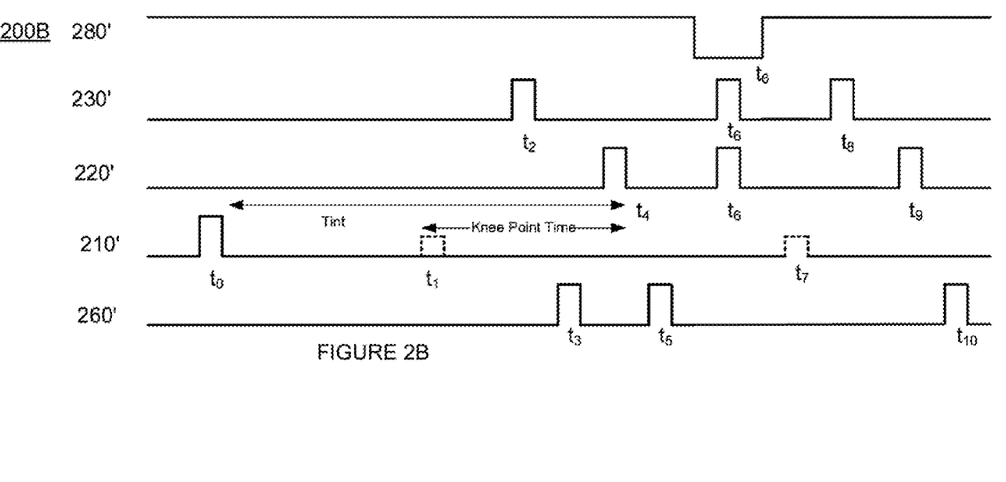

Referring now to FIG. 2B, a timing diagram 200B in accordance with one embodiment of the present invention is shown. Generation of the timing diagram 2008 enables measurement of the nominal reset voltage, e.g., A, the knee point voltage, e.g., C, and the pixel voltage at the end of the integration time, e.g., B1, B2, B3 and B4. It is appreciated that waveforms 280', 230', 220', 210 and 260' control their respective components 280, 230, 220, 210 and 260.

According to one embodiment, the photodiode 240 may fully reset (to high voltage) and initialized by asserting a signal 210 at time $t_0$. Resetting the photodiode 240 at time $t_0$ starts the integration time, e.g., $T_{int}$, of a pixel. The capacitor 250 may reset by asserting signal 230 at time $t_2$. It is appreciated that the transfer switch 220 may be asserted in order to transfer a charge from the photodiode 240 to the capacitor 250. Accordingly, charge collected by the capacitor 250 after having just been reset may be the charge associated with the nominal reset voltage, e.g., A. In order to measure the charge collected by the capacitor 250, the readout signal 260' may be asserted at time $t_3$. Accordingly, the nominal reset voltage, e.g., A, may be measured and determined according to the above.

While the above measurement of A was being done, the photodiode 240 was responding to the light on the pixel. It is appreciated that the knee point voltage may be applied at $t_1$. The knee point voltage may be asserted during the integration time of the pixel. As presented above, application of the knee point voltage causes the output of the photodiode 240 to reset to the knee point voltage, C, if the output voltage of the photodiode 240 may be less than the knee point voltage at $t_1$. Otherwise, the output voltage of the photodiode 240 remains the same without resetting to the knee point voltage.

It is appreciated that in this embodiment, the knee point voltage may be asserted when the pixel may be 80-90% into its integration time period but this can vary. It is also appreciated that the knee point voltage may be applied more than once. It is further appreciated that resetting the capacitor 250 during integration time at time $t_2$ and reading its value at $t_3$ may be either before or after the application of the knee point voltage at time $t_1$.

Asserting signal 220' at time $t_4$, which is at the end of the integration time period, transfers the charge associated with the output of the photodiode 240 to the capacitor 250. Accordingly, the capacitor 250 collects a charge associated with the output of the photodiode 240. In order to measure the collected charge on the capacitor 250, the readout signal 260' may be asserted at time $t_5$. The readout value at time $t_5$ is associated with the voltage value of the pixel, e.g., B1, B2, B3 and B4, at the end of the integration time.

As presented above, the knee point voltage, e.g., C, may be unknown for the given pixel and varies from one pixel to the next. In order to measure the knee point voltage value, e.g., C, the photodiode 240 may be initialized to a predetermined value, e.g., lowest voltage, at time $t_6$ by de-asserting the signal 280' and pulsing signals 230' and 220' at time $t_6$.

The value of the photodiode 240 may be known when it is initialized to a predetermined value, e.g., lowest voltage. Asserting the knee point voltage that may be unknown and measuring the collected charge resulting from initialization of the photodiode 240 and the application of the knee point voltage provides a measurement for C. Accordingly, after initializing the floating diffusion and photodiode 240 to a low voltage, the knee point voltage 210' may be asserted once again at time $t_7$. It is appreciated that the knee point voltage applied may be approximately the same as the knee point voltage applied at time $t_1$.

The capacitor 250 may reset by asserting the signal 230' at time $t_8$. It is appreciated that the capacitor 250 may be reset any time after the initialization of the photodiode 240 but before transferring a charge associated with the knee point voltage asserted at time $t_7$ to the capacitor 250. After the capacitor 250 may reset, the charge associated with the assertion of the knee point voltage at time $t_7$ may be transferred, e.g., by asserting the 220' signal at $t_9$, from the output of the photodiode 240 to the capacitor 250. The transferred charge may be collected by the capacitor 250. The collected charge may be associated with the assertion of the knee point voltage at time $t_7$. Accordingly, measuring the collected charge on the capacitor 250 provides a value associated with the knee point voltage. As such, the readout signal 260 may be asserted at time $t_{10}$ in order to measure the collected charge on the capacitor 250.

Accordingly, the values of the nominal voltage reset, e.g., A, the pixel voltage at end of the integration time, e.g., B1, B2, B3 and B4, and the knee point voltage value, e.g., C, are all measured using the timing scheme discussed above. The measured values may be reported and stored for the given pixel. For example, the measured values may be stored in a memory component. The measured values may be used to calculate the corrected data value for the pixel. This is done for each pixel in the pixel array.

According to one embodiment of the present invention the corrected data value may be:

$$\text{Corrected data value} = (A-B) \text{ if } (A-B)/\text{gain} > (A-C),$$

where A may be the measured nominal reset voltage value, B may be the pixel voltage at the end of the integration time, C may be the measured knee point voltage value and gain may be the total integration time divided by the first slop integration time. In other words, the photodiode 240 associated with the pixel has not reset to the knee point voltage during the integration time if the nominal reset voltage value minus the pixel voltage at the end of the integration time all divided by a gain may be greater than the nominal reset voltage value minus the knee point voltage value. Subtracting the measured nominal reset voltage from the pixel voltage at the end of the first slope integration time compensates for charge in the system that may be unrelated to the pixels response to the light, e.g., noise. Thus, accounting for the nominal reset voltage maximizes the image quality and linearity of the pixel response.

The corrected data value may be:

$$\text{Corrected data value} = [(A-C)+\text{gain}*(C-B)] \text{ if } (A-B)/\text{gain} < (A-C),$$

where A may be the measured nominal reset voltage value, B may be the pixel voltage at the end of the integration time and C may be the measured knee point voltage value. The gain may be associated with the ration of the integration period and the time which the knee point voltage may be asserted in order to linearize the behavior of the pixel. According to one embodiment, the gain may be:

$$\text{gain} = T_{int}/\text{Knee point time}.$$

In other words, the photodiode 240 associated with the pixel has been reset to the knee point voltage during the integration time because the nominal reset voltage value minus the pixel voltage at the end of the integration time all divided by the gain may be lower than the nominal reset voltage value minus the knee point voltage. Accounting for the nominal reset voltage A maximizes image quality, as discussed above. The corrected data value presented above, linearizes the pixel behavior by taking into consideration the photodiode behavior before and after application of the knee point voltage. In other words, the discontinuity and non-linearization introduced as a result of applying the knee point voltage C may be eliminated.

Figure 3:
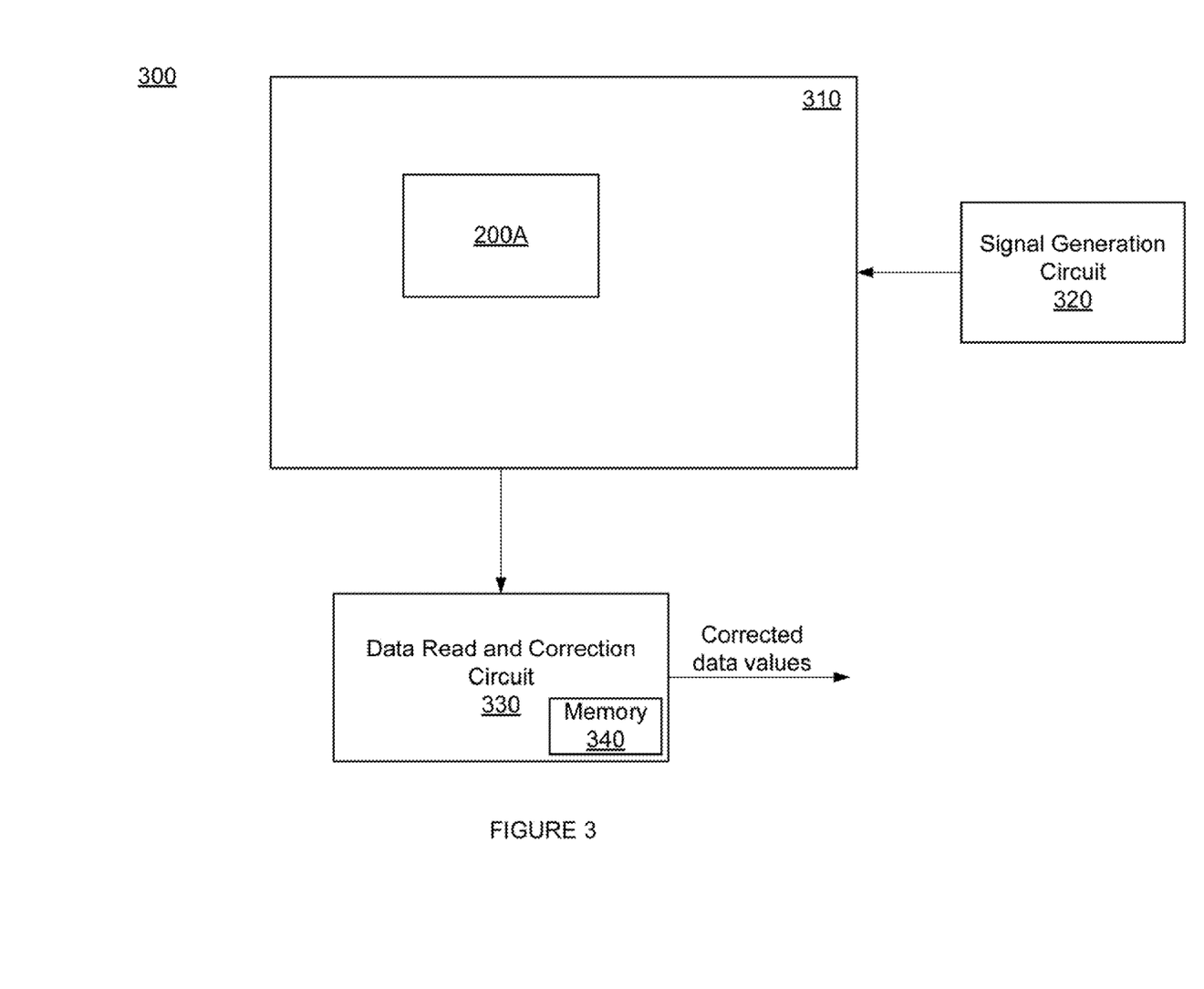
FIG. 3 shows a block diagram for extending a dynamic range of a pixel in accordance with an embodiment of the present invention.

Referring now to FIG. 3, a block diagram 300 for extending a dynamic range of a pixel in accordance with one embodiment of the present invention is shown. The block diagram 300 comprises a signal generation circuit 320, a pixel sensor circuit 310 and a data read and correction circuit 330. The signal generation circuit 320 generates control signals as shown in waveforms 200B, as presented above. The circuit 310 is substantially similar to the circuit 200A, as presented above. The circuit 310 reports the measured values, e.g., nominal reset voltage A, the pixel voltage at the end of integration time, B1, B2, B3 and B4 and the value of the knee point voltage to the data read and correction circuit 330. It is appreciated that the reported measured values may be stored in a memory component 340 within circuit 330. The data read and correction circuit 330 may use the measured values to calculate the corrected data values, as presented above.

Figure 4:
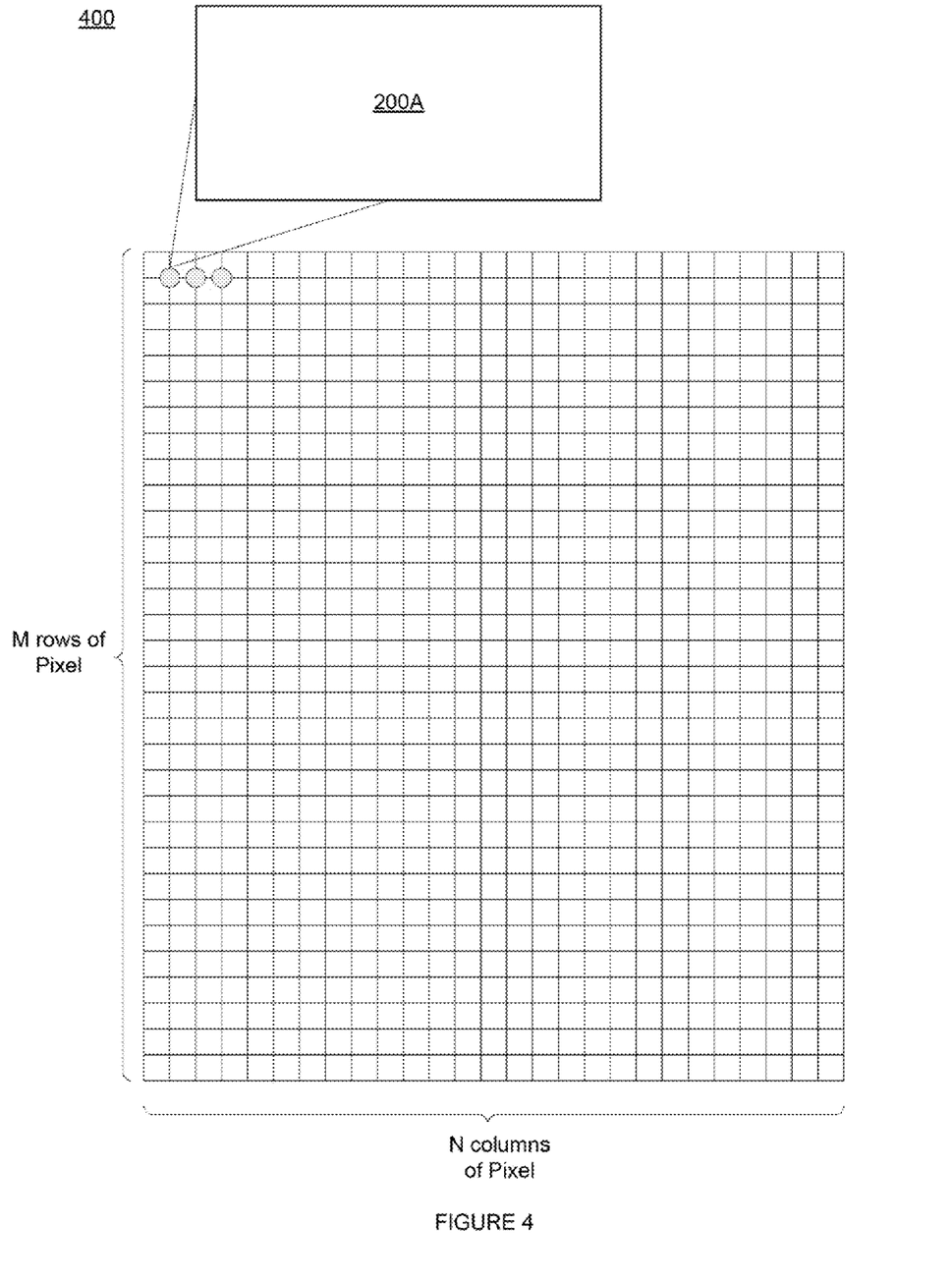
FIG. 4 shows pixels and circuits in accordance with an embodiment of the present invention.

FIG. 4 shows an array of pixels and sensor circuits 400 in accordance with one embodiment of the present invention. The pixels and circuits 400 are arranged in an array of m rows by n columns as might be found in a digital capture device. It is appreciated that each pixel may have a representative sensor circuit 200A associated therewith, as presented above.

Figure 5:
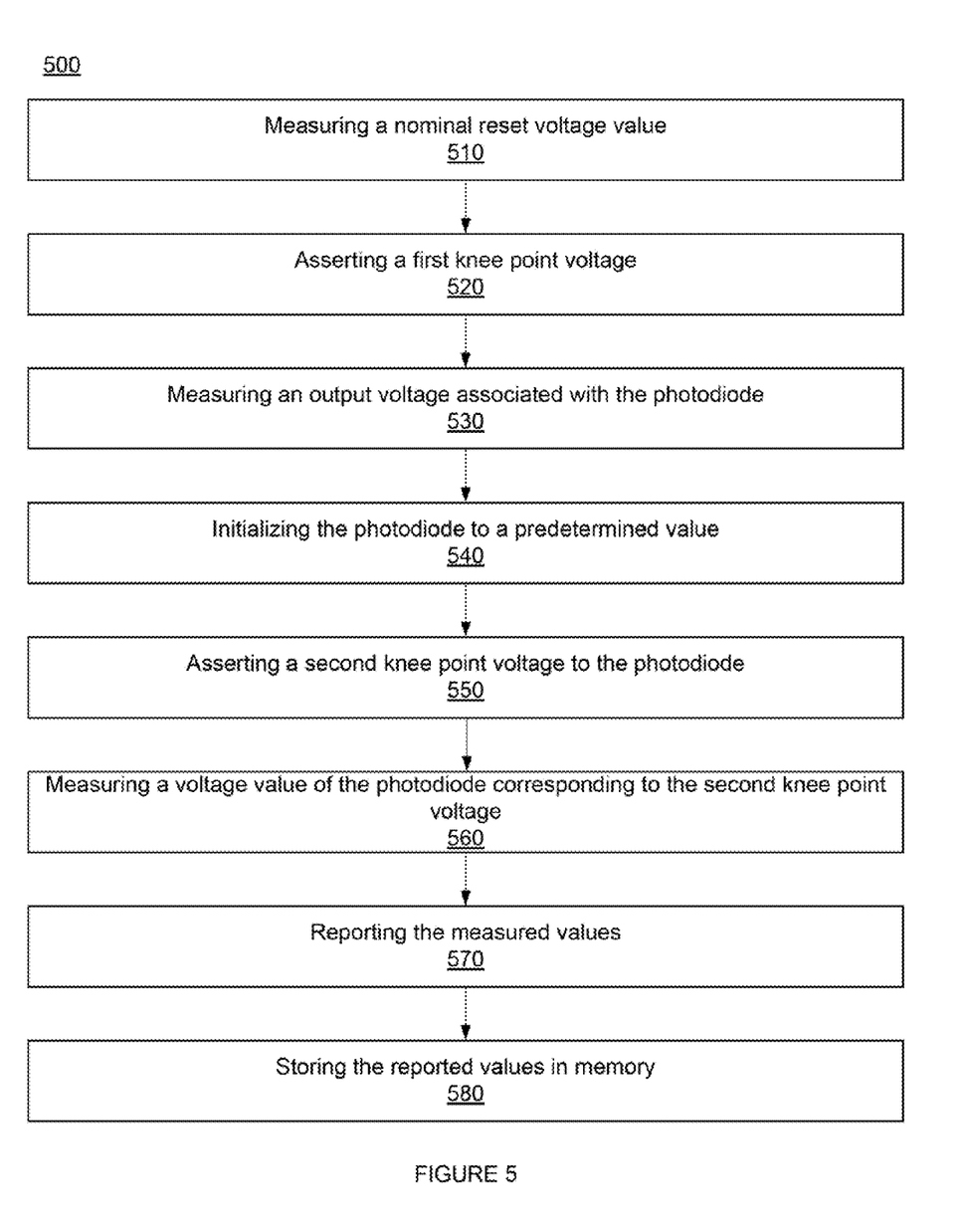
FIG. 5 shows flow diagram for measuring values used in calculating a corrected data value in accordance with an embodiment of the present invention.

FIG. 5 shows a flow diagram 500 for measuring values used in calculating a corrected data value in accordance with one embodiment of the present invention. At step 510, the nominal reset voltage value of the photodiode 240, e.g., C, may be measured. For example, the nominal reset voltage value may be measured by resetting the capacitor 250 at time $t_2$ (FIG. 2B) and by collecting and measuring the charge on the capacitor 250 at time $t_3$.

At step 520, a first knee point voltage may be applied at a predetermined time, e.g., $t_1$, after the start of the integration period. It is appreciated that the photodiode 240 may reset at the start of the integration period. The application of the knee point extends a dynamic range of the photodiode by resetting a voltage on the photodiode to the knee point voltage if the voltage on the photodiode is below the knee point voltage value at $t_1$. For example, the voltage values of pixels P3 and P4 (FIG. 1) are below the knee point voltage C at time $t_1$. Thus, the voltage value of the photodiode may reset to the knee point voltage for pixels P3 and P4 at $t_1$ but remain unchanged for pixels P1 and P2 since their value may be greater than the knee point voltage, e.g., C, $t_1$.

At step 530, the output voltage associated with the photodiode, e.g., pixels P1, P2, P3 and P4, at the end of the integration time may be measured. For example, the output voltage for pixels P1, P2, P3 and P4 are measured by asserting the transfer switch 220 (of each sensor) to transfer a charge from the photodiode 240 to the capacitor 250 at time $t_4$. The charge collected on the capacitor 250 may be measured by asserting the readout signal 260 at time $t_5$.

At step 540, the photodiode 240 may be initialized to a predetermined value, e.g., low voltage, at time $t_6$ (FIG. 2B). At step 550, a second knee point voltage may be asserted at the photodiode 240 at time $t_7$. It is appreciated that the second knee point voltage has approximately the same voltage value as the first knee point voltage. At step 560, a voltage value of the photodiode 240 corresponding to the second knee point voltage may be measured. For example, the capacitor 250 may reset by asserting the reset signal 230' at time $t_8$ (FIG. 2B). It is appreciated that the capacitor 250 may reset after the end of the initialization of the photodiode, e.g., $t_6$, but prior to the transfer of the charge, e.g., $t_9$, associated with the second knee point from the photodiode 240 to the capacitor 250.

Asserting the transfer signal 220' at time $t_9$ transfers the charge from the photodiode 240 to the capacitor 250. The transferred charge may be associated with the application of the second knee point voltage. Thus, the capacitor 250 collects a charge associated with the second knee point voltage. Asserting the readout signal 260' at time $t_{10}$ measures the collected charge on the capacitor 250. As a result, the value of the second knee point voltage may be measured which may be approximately the same as the first knee point voltage with respect to the pixel circuit.

At step 570, the measured values, e.g., nominal reset voltage A, the knee point voltage C and the pixel voltage at the end of the integration time B may be reported to the data read and correction circuit 330. At step 580, the measured values may be stored in memory for subsequent correction.

Figure 6:
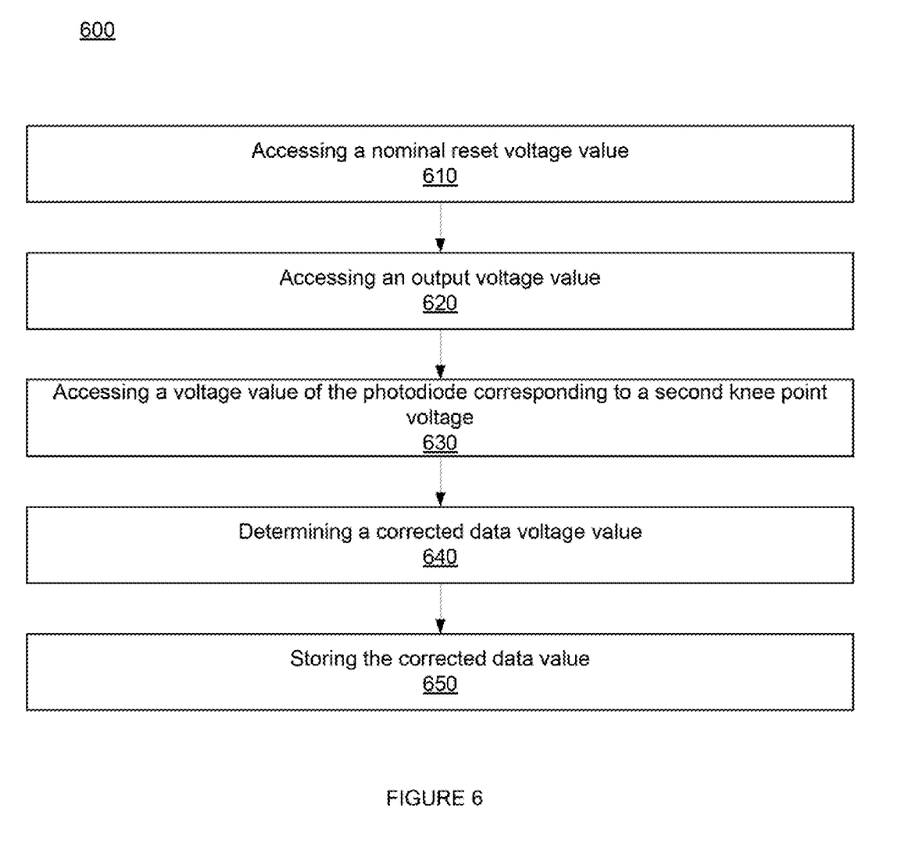
FIG. 6 shows flow diagram for calculating an offset value in accordance with one embodiment of the present invention.

FIG. 6 shows a flow diagram 600 for calculating a corrected data value in accordance with one embodiment of the present invention. At steps 610, 620 and 630, the reported values, as discussed above are accessed in no particular order. At step 640, the reported values may be used to calculate the corrected data value, as presented above. For example, the corrected data values are computed by:

$$\text{Corrected data value} = (A-B) \text{ if } (A-B)/\text{gain} > (A-C), \text{ and}$$

$$\text{Corrected data value} = [(A-C) + \text{gain}*(C-B)] \text{ if } (A-B)/\text{gain} < (A-C).$$

At step 650, the corrected data value may be stored. Correcting the pixel value linearizes the pixel behavior. It is appreciated that the measurements and corrections are performed with minimal impact on memory usage and sensor circuitry.

It is appreciated that embodiments described herein may be extended to multiple knee voltages asserted at different times during the integration period. Multiple knee voltages result in an increase in the number of stored knee voltage references and may need additional correction terms for each additional knee voltage point asserted.

Furthermore, it is appreciated that although specific circuitry is illustrated, other configurations may be equally used. For example, in one embodiment a knee point voltage may be applied to the storage node capacitor 250 through the reset switch 230 while continuously integrating the photocurrent induced in photodiode 240. In another embodiment, a knee point voltage may be applied to the storage node capacitor 250 through the reset switch 230 while continuously turning on the transfer switch 220 to connect the photodiode 240 and the capacitor 250 or by periodically turning the transfer switch 220 to periodically transfer charge from the photodiode 240 to the capacitor 250.

In the foregoing specification, embodiments of the invention have been described with reference to numerous specific details that may vary from implementation to implementation. The specification and drawings are, accordingly, to be regarded in an illustrative rather than a restrictive sense.

What is claimed is:

1. A method of measuring signals related to a sensor device, said method comprising:
   measuring a nominal reset voltage value of said sensor device;
   asserting a first knee point voltage to a photodiode of said sensor device, wherein said first knee point voltage resets a voltage on said photodiode to said first knee point voltage when the voltage of said photodiode is below said first knee point voltage;
   measuring an output voltage associated with said photodiode at an end of an integration period;
   subsequent to said integration period, asserting a second knee point voltage to said photodiode, wherein said second knee point voltage has a value approximately equal to a value of said first knee point voltage; and
   measuring a voltage value of said photodiode in response to said asserted second knee point voltage; and
   reporting said nominal reset voltage value, said output voltage, and said voltage value of said photodiode in response to said second knee point voltage.

2. The method as described in claim 1, wherein said measuring said nominal reset voltage value comprises:
   resetting a capacitor of said sensor device; and
   collecting and measuring a first charge on said capacitor just after said resetting.

3. The method as described in claim 1 further comprising:
   subsequent to said measuring said output voltage and prior to said asserting said second knee point voltage, initializing said photodiode to a predetermined voltage value.

4. The method as described in claim 1, wherein said first knee point voltage is asserted at a predetermined time after a start of said integration period and prior to the end of said integration period.

5. The method as described in claim 1, wherein said measuring said voltage value of said photodiode in response to said asserted second knee pint voltage comprises:
   resetting a capacitor of said sensor device;
   subsequent to said measuring said output voltage and prior to said asserting said second knee point voltage, initializing said photodiode to a predetermined voltage value;
   subsequent to said asserting said second knee point voltage, collecting a charge on said capacitor; and
   measuring said collected charge on said capacitor.

6. The method as described in claim 1, wherein said measuring said output voltage comprises:
   resetting a capacitor of said sensor device;
   transferring a charge from said photodiode to said capacitor after said integration period;
   collecting said charge on said capacitor; and
   measuring said collected charge on said capacitor, wherein said collected charge is related to a voltage associated with said photodiode at the end of said integration period and as effected by said first knee point voltage asserted thereto.

7. The method as described in claim 1 further comprising:
   storing in a memory said nominal reset voltage value, said output voltage and said voltage value of said photodiode in response to said asserted second knee point voltage.

8. A method of calculating a corrected data value for a sensor circuit, said method comprising:
   accessing a nominal reset voltage value, wherein said nominal reset voltage value is a first charge collected on a capacitor of said sensor circuit just after reset thereof;
   accessing an output voltage value associated with said photodiode at an end of an integration period of a photodiode of said sensor circuit, wherein a first knee point voltage is asserted, during said integration time, to said photodiode which resets a voltage on said photodiode to said first knee point voltage when said photodiode voltage is below said first knee point voltage;
   measuring a voltage value of said photodiode corresponding to a second knee point voltage, wherein said second knee point voltage is approximately equal to said first knee point voltage;
   determining said corrected data value to be said nominal reset voltage minus said output voltage value when said nominal reset voltage value minus said output voltage value, divided by a gain, is greater than said nominal reset voltage value minus said voltage value of said photodiode; and
   determining said corrected data value to be said voltage value of said photodiode minus said output voltage value, multiplied by said gain, plus said nominal voltage value minus said voltage value of said photodiode when said nominal reset voltage value minus said output voltage value, divided by said gain, is less than said nominal reset voltage value minus said voltage value of said photodiode.

9. The method as described in claim 8, wherein said output voltage value is determined by measuring a second charge collected on said capacitor at the end of said integration period and as affected by said first knee point voltage asserted, wherein said second charge is transferred from said photodiode to said capacitor.

10. The method as described in claim 8, wherein measuring said voltage value of said photodiode corresponding to a second knee point voltage comprises:
    resetting said capacitor;
    initializing said photodiode to a predetermined voltage value;
    subsequent to asserting said second knee point voltage, collecting a second charge on said capacitor, wherein said second charge is a charge associated with said second knee point voltage; and
    measuring said collected second charge on said capacitor.

11. The method as described in claim 8, wherein said gain is a ratio of a duration of said integration period to an elapsed time from application of said first knee point voltage to the end of said integration time.

12. The method as described in claim 8, wherein said first knee point voltage is asserted prior to the end of said integration period, and wherein said first knee point voltage is asserted at a predetermined time after said integration period starts and before said integration period ends.

13. The method as described in claim 8, wherein said accessing said nominal reset voltage value comprises:
    resetting said capacitor; and
    collecting and measuring said first charge on said capacitor just after reset thereof.

14. The method as described in claim 8 further comprising:
    storing said corrected data value in a memory and associating said corrected data value with said sensor circuit.

15. A process to measure and correct signals related to a photodiode based sensor, the process configured to:
    measure a nominal reset voltage value of said sensor;
    assert a first knee point voltage to a photodiode of said sensor, wherein said first knee point voltage resets a voltage on said photodiode to said first knee point voltage when said photodiode voltage is below said first knee point voltage;

measure an output voltage associated with said photodiode at an end of an integration period of said photodiode;

subsequent to the end of said integration period, assert a second knee point voltage to said photodiode, wherein said second knee point voltage has a value approximately equal to a value of said first knee point voltage;

measure a voltage value of said photodiode in response to said asserted second knee point voltage;

determine a corrected data value to be said nominal reset voltage minus said output voltage value when said nominal reset voltage value minus said output voltage value, divided by a gain, is greater than said nominal reset voltage value minus said voltage value of said photodiode; and determine said corrected data value to be said voltage value of said photodiode minus said output voltage value, multiplied by said gain, plus said nominal voltage value minus said voltage value of said photodiode when said nominal reset voltage value minus said output voltage value, divided by said gain, is less than said nominal reset voltage value minus said voltage value of said photodiode.

16. A process as described in claim 15, wherein said measuring said nominal reset voltage value comprises:

resetting a capacitor of said sensor; and collecting and measuring a first charge on said capacitor just after reset thereof.

17. The process as described in claim 15, wherein said measuring said output voltage comprises:

resetting a capacitor of said sensor;

transferring a charge from said photodiode to said capacitor after said integration period; and measuring said collected charge on said capacitor, wherein said collected charge is related to said voltage associated with said photodiode at the end of said integration period and as affected by said first knee point voltage asserted thereto.

18. The process as described in claim 15, wherein said gain is a ratio of a duration of said integration period to an elapsed time from application of said first knee point voltage to the end of said integration time.

19. The process as described in claim 15 further comprising:

storing in a memory said nominal reset voltage value, said output voltage and said voltage value of said photodiode in response to said asserted second knee point voltage.

20. The process as described in claim 15 further comprising:

storing said corrected data value in a memory.

21. The process as described in claim 15, wherein said first knee point voltage is asserted at a predetermined time after a start of said integration period and prior to the end of said integration period, and wherein said second knee pint voltage is asserted after the end of said integration period.

* * * * *

UNITED STATES PATENT AND TRADEMARK OFFICE
CERTIFICATE OF CORRECTION

| | | |
|---|---|---|
| PATENT NO. | : 8,013,590 B1 | Page 1 of 1 |
| APPLICATION NO. | : 12/501811 | |
| DATED | : September 6, 2011 | |
| INVENTOR(S) | : Tom Walschap | |

It is certified that error appears in the above-identified patent and that said Letters Patent is hereby corrected as shown below:

Col. 9, Line 19, please delete "and"

Col. 9, Line 40, please change "pint" to --point--

Col. 12, Line 26, please change "pint" to --point--

Signed and Sealed this
First Day of May, 2012

David J. Kappos
*Director of the United States Patent and Trademark Office*